(12) United States Patent
Egawa

(10) Patent No.: US 11,244,883 B2
(45) Date of Patent: Feb. 8, 2022

(54) SEMICONDUCTOR DEVICE

(71) Applicant: Renesas Electronics Corporation, Tokyo (JP)

(72) Inventor: Hidenori Egawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/670,725

(22) Filed: Oct. 31, 2019

(65) Prior Publication Data

US 2020/0066611 A1 Feb. 27, 2020

Related U.S. Application Data

(63) Continuation of application No. 14/596,991, filed on Jan. 14, 2015, now abandoned, which is a
(Continued)

(30) Foreign Application Priority Data

Jul. 15, 2009 (JP) .................................. 2009-166975

(51) Int. Cl.
*H01L 23/34* (2006.01)
*H01L 23/373* (2006.01)
(Continued)

(52) U.S. Cl.
CPC .............. *H01L 23/34* (2013.01); *H01L 23/12* (2013.01); *H01L 23/3735* (2013.01);
(Continued)

(58) Field of Classification Search
CPC ......... H01L 2224/131; H01L 2924/014; H01L 2224/81385; H01L 23/12; H01L 23/34;
(Continued)

(56) References Cited

U.S. PATENT DOCUMENTS 4,961,107 A   10/1990 Geist et al.
6,559,524 B2   5/2003 Seko
(Continued)

FOREIGN PATENT DOCUMENTS

CN   1979829 A    6/2007
JP   41-10275 U   5/1966
(Continued)

OTHER PUBLICATIONS

Japanese Office Action dated Jun. 2, 2020, in Japanese Patent Application No. 2019-154372 with an English translation.
(Continued)

*Primary Examiner* — Matthew C Landau
*Assistant Examiner* — Dmitriy Yemelyanov
(74) *Attorney, Agent, or Firm* — McGinn IP Law Group, PLLC

(57) ABSTRACT

A semiconductor device includes a wiring substrate including a first surface, a second surface opposite to the first surface, a first heat dissipation conductive pattern formed on the first surface, a second heat dissipation conductive pattern formed on the first surface, a first wiring formed on the first surface, and a second wiring formed on the first surface. The semiconductor device also includes a semiconductor chip disposed on the wiring substrate and including a third surface and a fourth surface opposite to the third surface. In plan view, the second wiring is adjacent to the first and second heat dissipation conductive patterns without intervening any wiring and any conductive pattern between the second wiring and the first and second heat dissipation conductive patterns.

19 Claims, 10 Drawing Sheets

Related U.S. Application Data continuation of application No. 14/186,592, filed on Feb. 21, 2014, now Pat. No. 8,975,762, which is a continuation of application No. 13/762,512, filed on Feb. 8, 2013, now Pat. No. 8,686,574, which is a continuation of application No. 12/801,303, filed on Jun. 2, 2010, now Pat. No. 8,384,230.

(51) Int. Cl.
  *H01L 23/498* (2006.01)
  *H01L 23/00* (2006.01)
  *H01L 23/12* (2006.01)
  *H01L 23/50* (2006.01)

(52) U.S. Cl.
  CPC .... *H01L 23/4985* (2013.01); *H01L 23/49838* (2013.01); *H01L 23/50* (2013.01); *H01L 24/14* (2013.01); *H01L 24/17* (2013.01); *H01L 24/16* (2013.01); *H01L 2224/131* (2013.01); *H01L 2224/81385* (2013.01); *H01L 2924/01079* (2013.01); *H01L 2924/14* (2013.01)

(58) Field of Classification Search
  CPC .......... H01L 23/3735; H01L 23/49838; H01L 23/4985; H01L 23/50; H01L 24/14; H01L 24/16; H01L 24/17; H01L 2924/01079; H01L 2924/14; H01L 23/00; H01L 23/373; H01L 23/498
  See application file for complete search history.

(56) References Cited

U.S. PATENT DOCUMENTS

| | | | |
|---|---|---|---|
| 6,744,120 B1 | 6/2004 | Yanagisawa | |
| 6,946,802 B2 | 9/2005 | Hayashi | |
| 7,763,986 B2 | 7/2010 | Kim | |
| 7,821,115 B2 | 10/2010 | Sasaki et al. | |
| 2002/0187334 A1 | 12/2002 | Ichiryu et al. | |
| 2003/0197670 A1 | 10/2003 | Mori | |
| 2006/0131064 A1* | 6/2006 | Hagiwara | H01L 23/4985 174/250 |
| 2006/0213684 A1 | 9/2006 | Sakata | |
| 2007/0007650 A1 | 1/2007 | Tsukiji | |
| 2007/0013056 A1 | 1/2007 | Lee et al. | |
| 2007/0126090 A1* | 6/2007 | Sasaki | H05K 1/0209 257/668 |
| 2007/0138654 A1 | 6/2007 | Kim | |
| 2008/0043195 A1* | 2/2008 | Shiki | H01L 23/4985 349/150 |
| 2008/0061432 A1 | 3/2008 | Seko et al. | |
| 2008/0088039 A1 | 4/2008 | Lee et al. | |
| 2008/0128902 A1 | 6/2008 | Chung et al. | |
| 2008/0157337 A1 | 7/2008 | Chen | |
| 2008/0203563 A1 | 8/2008 | Takahashi | |
| 2009/0020316 A1 | 1/2009 | Wu et al. | |
| 2009/0108438 A1 | 4/2009 | Iwata et al. | |
| 2010/0025681 A1 | 2/2010 | Katoh et al. | |
| 2010/0302474 A1 | 12/2010 | Katoh | |
| 2011/0012265 A1 | 1/2011 | Egawa | |

FOREIGN PATENT DOCUMENTS

| | | | |
|---|---|---|---|
| JP | 64-084625 | A | 3/1989 |
| JP | H09-21941 | A | 8/1997 |
| JP | 2000-174075 | A | 6/2000 |
| JP | 2002-093861 | A | 3/2002 |
| JP | 2003-068804 | A | 3/2003 |
| JP | 2004-111996 | A | 4/2004 |
| JP | 2004-207296 | A | 7/2004 |
| JP | 2006-147983 | A | 6/2006 |
| JP | 2006-286837 | A | 10/2006 |
| JP | 2007-027682 | A | 2/2007 |
| JP | 2007-158001 | A | 6/2007 |
| JP | 2008-066605 | A | 3/2008 |
| JP | 2008-177402 | A | 7/2008 |
| JP | 2008-211073 | A | 9/2008 |
| JP | 2009-027135 | A | 2/2009 |
| JP | 2009-110980 | A | 5/2009 |
| JP | 2009-135340 | A | 6/2009 |
| JP | 2011-023528 | A | 2/2011 |
| KR | 10-0729537 | | 6/2007 |
| WO | WO 00/54323 | A1 | 9/2000 |
| WO | WO 2008/072551 | A1 | 6/2008 |

OTHER PUBLICATIONS

Japanese Office Action dated Nov. 27, 2012 with a partial English translation.
Japanese Office Action dated Apr. 9, 2013 with a partial English translation.
Chinese Office Action dated Nov. 8, 2013 with English translation.
Chinese Office Action dated Jul. 7, 2014 with an English translation.
Japanese Office Action dated Nov. 6, 2018, in Japanese Patent Application No. 2617-244896 with an English translation.
Japanese Office Action dated Jun. 4, 2019, in Japanese Patent Application No. 2017-244896 with an English translation.
Japanese Office Action dated Nov. 22, 2016, with an English translation.
Japanese Office Action dated Oct. 3, 2017, with an English translation.
Office Action dated Apr. 19, 2018, with an English translation.
Japanese Office Action dated Mar. 14, 2017, with an English translation.
Chinese Office Action dated Nov. 4, 2015 with an English translation.
Chinese Office Action dated Feb. 15, 2017, with an English translation.
Chinese Office Action dated Apr. 5, 2016 with an English translation.
Chinese Office Action dated Aug. 10, 2017, with an English translation thereof.

\* cited by examiner

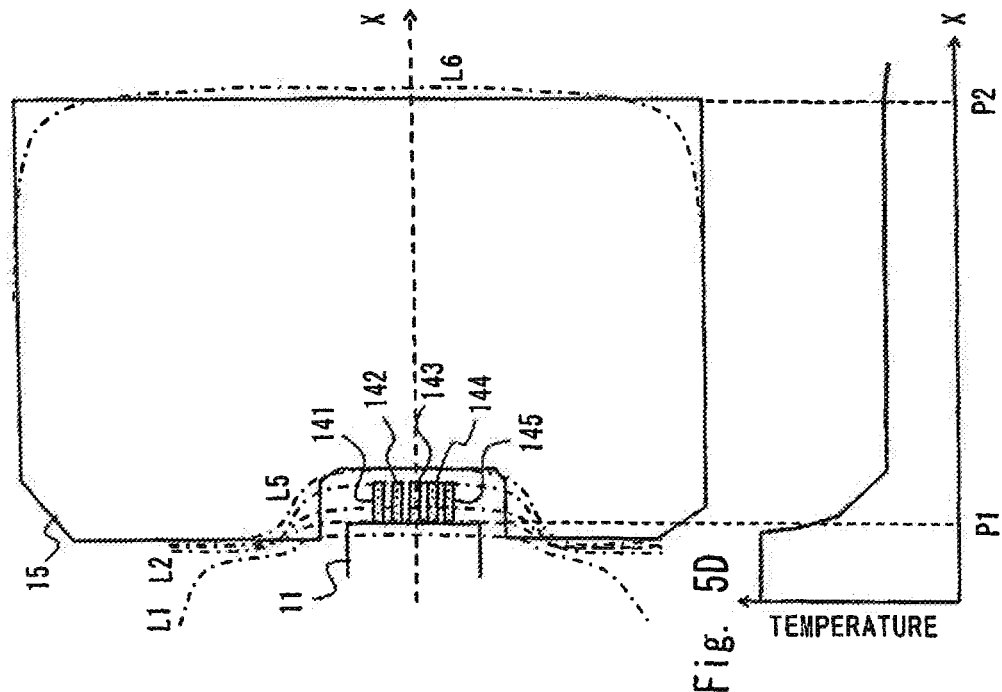
Fig. 5C
Fig. 5D
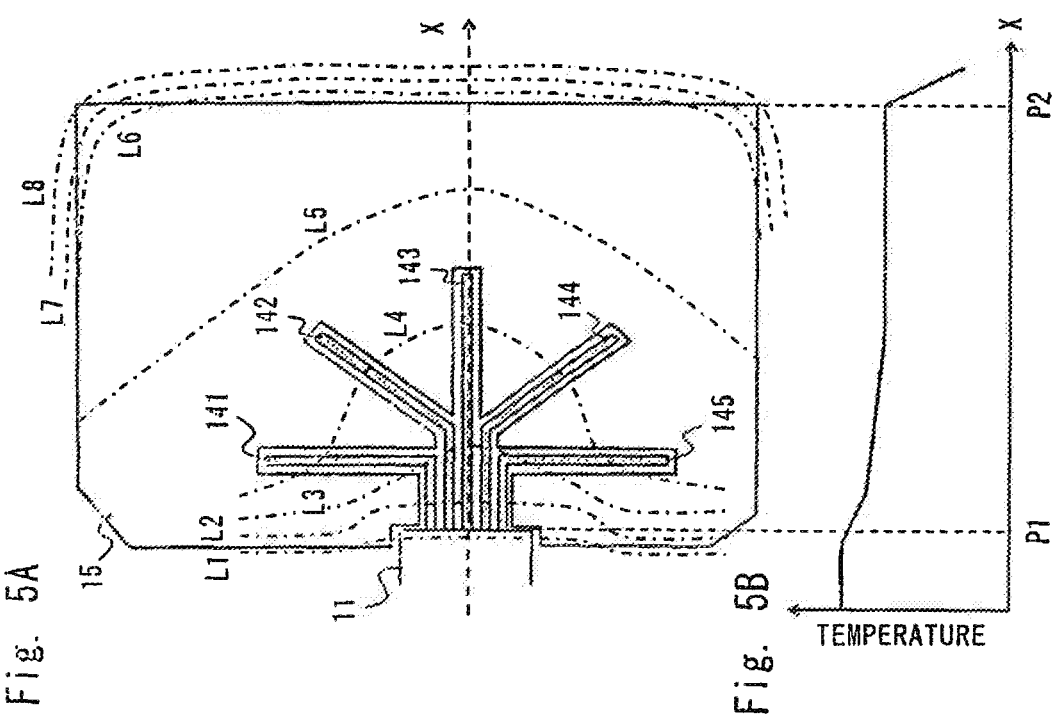
Fig. 5A
Fig. 5B

SEMICONDUCTOR DEVICE

This Application is a Continuation Application of U.S. patent application Ser. No. 14/596,991, filed on Jan. 14, 2015, which is Continuation Application of U.S. patent application Ser. No. 14/186,592, filed on Feb. 21, 2014, (Now U.S. Pat. No. 8,975,762), which is a Continuation Application of U.S. patent application Ser. No. 13/762,512, (Now U.S. Pat. No. 8,686,574) filed on Feb. 8, 2013, which is a Continuation Application of U.S. patent application Ser. No. 12/801,303 (Now U.S. Pat. No. 8,384,230), and which claims priority from JPA No. 2009-166975, incorporated herein by reference.

INCORPORATION BY REFERENCE

This application is based upon and claims the benefit of priority from Japanese patent application No. 2009-166975, filed on Jul. 15, 2009, the disclosure of which is incorporated herein in its entirety by reference.

BACKGROUND

1. Field of the Invention

The present invention relates to a semiconductor device that includes a wiring board and an integrated circuit (IC) chip mounted thereon and, particularly, to a heat dissipation structure in a semiconductor device.

2. Description of Related Art

The heat value of an IC chip such as a liquid crystal driver IC during operation is on the increase. The increase in the IC chip heat value is particularly significant in a semiconductor device using a flexible wiring board compared to a semiconductor device using a rigid wiring board. Therefore, a heat dissipation structure in a semiconductor device becomes increasingly important.

A flexible wiring board has a structure in which a conductor layer such as lines is formed on a flexible insulating film. For example, the conductor layer is formed by applying copper foil to a polyimide film, which is the insulating film. The flexible wiring board has a lower heat capacity and a lower mechanical strength compared to the rigid wiring board for its thin profile. It is thus generally difficult to mount heavy parts such as a heat sink on the flexible wiring board.

In order to deal with the heat issue when using a flexible wiring board, Japanese Unexamined Patent Application Publications Nos. 2007-158001 and 2004-111996 disclose a heat dissipation structure of a tape carrier package (TCP), which is one type of a semiconductor device using a flexible wiring board. The TCP disclosed in Japanese Unexamined Patent Application Publication No. 2007-158001 (JP 2007-158001 A) has the following structure. Namely, an IC chip that has an electrode for heat dissipation separately from an electrode used for signal input/output with an external device is mounted on a flexible wiring board. Further, a heat dissipation conductive pattern that is physically isolated from a signal line pattern is formed on the surface of the flexible wiring board. The heat dissipation electrode of the IC chip and the heat dissipation conductive pattern of the wiring board are connected through a conductor (gold bump, solder etc.). In this specification, connection through a conductor such as gold bump or solder is referred to as "conductor connection".

Japanese Unexamined Patent Application Publication No. 2004-111996 (JP 2004-111996 A) also discloses a technique that forms a heat dissipation conductive pattern on the surface of a flexible wiring board for the purpose of heat dissipation of an IC chip mounted on the flexible wiring board. However, in JP 2004-111996 A, no electrodes of the IC chip and the heat dissipation conductive pattern are connected. Specifically, JP 2004-111996 A discloses a structure in which the IC chip and the heat dissipation conductive pattern are physically spaced (FIG. 3 in JP 2004-111996 A) and a structure in which the IC chip and the heat dissipation conductive pattern are physically contacted (FIG. 6 in JP 2004-111996 A). More specifically, FIGS. 3 and 6 of JP 2004-111996 A show structures in which no electrodes of the IC chip and the heat dissipation conductive pattern are in conductor connection and the heat dissipation conductive pattern is formed opposite to all over the length of the short side of the rectangular IC chip.

SUMMARY

As described above, the semiconductor device disclosed in JP 2007-158001 A has the heat dissipation structure in which the heat dissipation conductive pattern that is formed on the flexible wiring board and the heat dissipation electrode of the IC chip are connected by a conductor with a low heat resistance. The heat resistance between the IC chip and the heat dissipation conductive pattern thereby decreases, which allows improvement in heat dissipation effect. However, there are many cases where conductor connection cannot be made between the electrode of the IC chip and the heat dissipation conductive pattern, such as when terminals with different potentials are arranged irregularly in the vicinity of the IC chip or when there is a concern about electro-static discharge (ESD). For example, when the IC chip is a driver IC that drives a liquid crystal display panel, the driver IC can suffer damage from discharge when a charged human body comes into contact with the liquid crystal display panel. Because the heat dissipation conductive pattern generally has a large surface area to enhance the heat dissipation effect, conductor connection between the heat dissipation conductive pattern and the IC chip causes an increase in the probability that the IC chip is damaged by ESD.

On the other hand, as described above, the heat dissipation structures disclosed in JP 2004-111996 A are structures in which conductor connection is not made between the electrode of the IC chip and the heat dissipation conductive pattern. Specifically, FIGS. 3 and 6 of JP 2004-111996 A show the structures in which the heat dissipation conductive pattern and the chip electrode are electrically insulated, and the heat dissipation conductive pattern is formed opposite to all over the length of one side of the rectangular chip. The structure has an advantage that it can reliably avoid the damage of the IC chip by ESD, and it is thus effective in the case where conductor connection cannot be made between the electrode of the IC chip and the heat dissipation conductive pattern.

However, it is considered to be difficult in practice to adopt the structure in which the IC chip and the heat dissipation conductive pattern are physically in contact without contact between the electrode of the IC chip and the heat dissipation conductive pattern (FIG. 6 in JP 2004-111996 A), which is one of the heat dissipation structures disclosed in JP 2004-111996 A. It is particularly difficult in a flip-chip package (face-down package) where the IC chip is mounted with the surface on which a functional circuit and an electrode are formed facing the wiring board. A large number of electrode pads are often arranged in the peripheral part of the IC chip, which is required to decrease in size, in terms of ensuring stable connection, and it is normally difficult to make physical contact between the heat dissipation conductive pattern and the IC chip by avoiding contact with the electrode.

On the other hand, regarding the structure in which the IC chip and the heat dissipation conductive pattern are physically spaced (FIG. 3 in JP 2004-111996 A), which is the other one of the heat dissipation structures disclosed in JP 2004-111996 A, the length of the interface at which the rectangular IC chip and the heat dissipation conductive pattern are placed opposite to each other is as short as the length of the short side of the IC chip. Thus, heat conduction from the IC chip to the heat dissipation conductive pattern is not sufficient, which raises the IC chip temperature and thus causes an increase in the temperature gradient near the IC chip.

As described above, the heat dissipation structures disclosed in JP 2007-158001 A and JP 2004-111996 A have a problem that heat conduction from the IC chip to the heat dissipation conductive pattern is not sufficient when conductor connection cannot be made between the electrode of the IC chip and the heat dissipation conductive pattern.

An exemplary aspect of the present invention is a semiconductor device which includes a wiring board that has a conductive pattern formed on at least one principal surface, and an IC chip that is mounted on the wiring board. The IC chip includes a plurality of electrodes to make conductor connection with the wiring board.

The conductive pattern includes a lead line pattern and a heat dissipation pattern. The lead line pattern is connected with at least one of the plurality of electrodes through a conductor. The heat dissipation pattern is physically spaced from each of the IC chip and the lead line pattern and has a larger surface area than the lead line pattern.

Further, the lead line pattern and the heat dissipation pattern are placed opposite to each other with a gap therebetween, and opposite parts of the lead line pattern and the heat dissipation pattern respectively have interdigitated shapes and are arranged with the respective interdigitated shapes engaging with each other with the gap therebetween.

According to the exemplary aspect of the present invention described above, it is possible to efficiently release heat from the IC chip by the conductive lead line pattern that is in conductor connection with the electrode of the IC chip. Further, because the lead line pattern and the heat dissipation pattern are arranged in such a way that their interdigitated shapes engage with each other with a gap therebetween, it is possible to make the total extension of the gap long enough and reduce the heat resistance between the lead line pattern and the heat dissipation pattern. It is thereby possible to reduce the heat resistance from the IC chip to the heat dissipation pattern, thereby enhancing the heat dissipation effect. Further, it is easy to make the total extension of the longitudinal length of the gap longer than the length of the short side of the IC chip.

According to the exemplary aspect of the present invention described above, even when conductor connection cannot be made between the electrode of the IC chip and the heat dissipation pattern, it is possible to reduce the heat resistance between the IC chip and the heat dissipation conductive pattern and enhance the heat dissipation effect.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 5A and 5B are a plan view and a temperature distribution graph of a semiconductor device to describe the heat dissipation effect of the semiconductor device shown in FIG. 1;

FIGS. 5C and 5D are a plan view and a temperature distribution graph of a semiconductor device according to a comparative example;

DETAILED DESCRIPTION OF THE EXEMPLARY EMBODIMENTS

Figure 1:
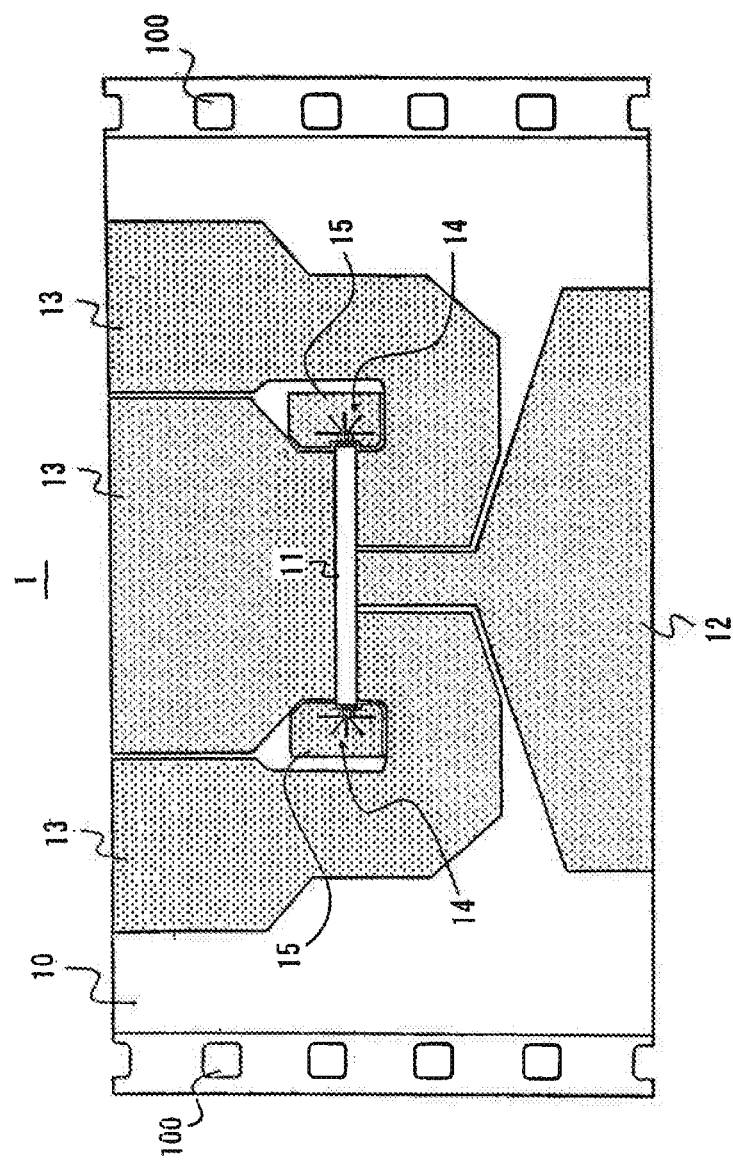
FIG. 1 is a plan view schematically showing the structure of a semiconductor device according to a first exemplary embodiment of the invention.

Hereinafter, exemplary embodiments of the present invention will be described in detail with reference to the appended drawings. Note that, in the appended drawings, structural elements that have substantially the same function and structure are denoted with the same reference numerals, and repeated explanation of these structural elements is omitted.

First Exemplary Embodiment

A semiconductor device according to this exemplary embodiment is a tape carrier package (TCP) and, specifically, a TCP that incorporates a driver IC for driving a liquid crystal display panel. FIG. 1 is a schematic plan view of a TCP 1 according to the exemplary embodiment. The TCP 1 includes a flexible wiring board 10 and an IC chip 11. The wiring board 10 has a structure in which a conductive pattern is formed by copper foil or the like on a flexible insulating film such as a polyimide film. The conductive pattern includes an input signal line pattern 12, an output signal line pattern 13, a lead line pattern 14 and a heat dissipation pattern 15. Note that a plurality of sprocket holes 100 made at regular intervals along both ends of the flexible wiring board 10 are used for carrying and positioning of a carrier tape before the TCP 1 is cut out.

The IC chip 11 is flip-chip mounted on the principal surface of the flexible wiring board 10 where the conductive pattern is formed. The IC chip 11 has a plurality of first electrodes 111 that are used for inputting and outputting power supply, display data, control signals or the like to and from an external device (e.g. a display controller on the input side, a liquid crystal display panel on the output side etc.) and a plurality of second electrodes 112 that are usually not connected with an external device and principally used for the purpose of ensuring stable connection and dissipating heat.

Figure 2:
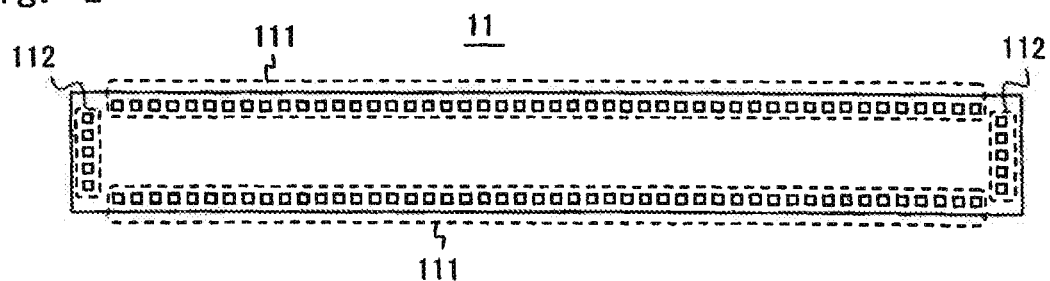
FIG. 2 is a plan view schematically showing an example of electrode layout of an IC chip included in the semiconductor device shown in FIG. 1.

FIG. 2 is a plan view showing an example of layout of the electrodes 111 and 112 formed on the principal surface of the IC chip 11. In the example of FIG. 2, the plurality of first electrodes 111 are arranged along the long side of the rectangular principal surface of the IC chip 11, and the plurality of second electrodes 112 are arranged along the short side of the principal surface of the IC chip 11. Each of the plurality of first electrodes 111 is joined to the input signal line pattern 12 or the output signal line pattern 13 by a conductor bump (Au bump, solder bump etc.). Further, each of the plurality of second electrodes 112 is joined to the lead line pattern 14 by a conductor bump. Note that the arrangement is just an example, and the second electrodes 112 are not necessarily arranged along the short side only but may be arranged along the long side or arranged along the both sides.

Referring back to FIG. 1, the input signal line pattern 12 and the output signal line pattern 13 are used for inputting and outputting power supply, display data, control signals or the like between the IC chip 11 and an external device (e.g. a display controller on the input side, a liquid crystal display panel on the output side etc.). Although not shown in FIG. 1, the input signal line pattern 12 includes a plurality of fine input lines, and the output signal line pattern 13 includes a plurality of fine output lines.

The lead line pattern 14 is in conductor connection with at least one electrode of the first electrodes 111 and the second electrodes 112. The heat dissipation pattern 15 is physically spaced from each of the IC chip 11, the signal line patterns 12 and 13 and the lead line pattern 14, and it has a larger surface area than the lead line pattern 14. Further, the lead line pattern 14 and the heat dissipation pattern 15 are placed opposite to each other with a gap therebetween. The respective parts of the lead line pattern 14 and the heat dissipation pattern 15 which are opposite to each other have an interdigitated shape, and they are arranged in such a way that the respective interdigitated shapes engage with each other with a gap therebetween. In other words, the boundary line of the opposite parts of the lead line pattern 14 and the heat dissipation pattern 15 has an interdigitated shape. The shape of the boundary line may be also regarded as a corrugated, zigzag, meandering or star-like shape.

Figure 3:
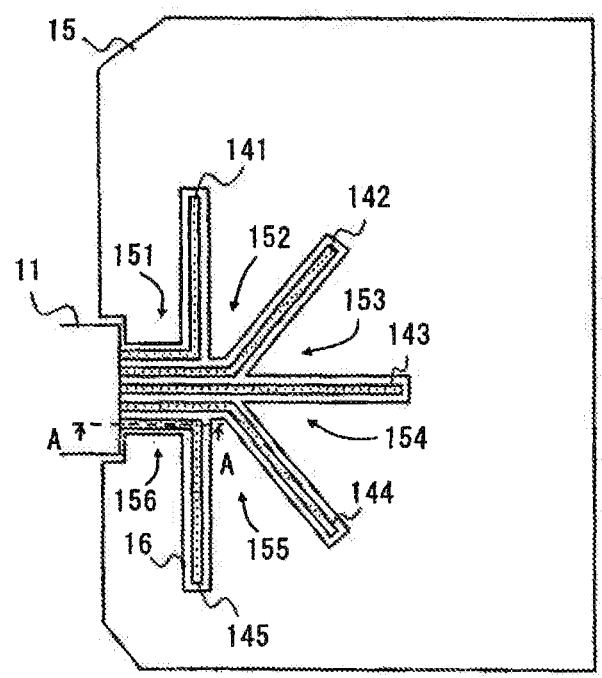
FIG. 3 is an enlarged plan view showing the vicinity of a lead line pattern and a heat dissipation pattern included in the semiconductor device shown in FIG. 1.
Figure 4:
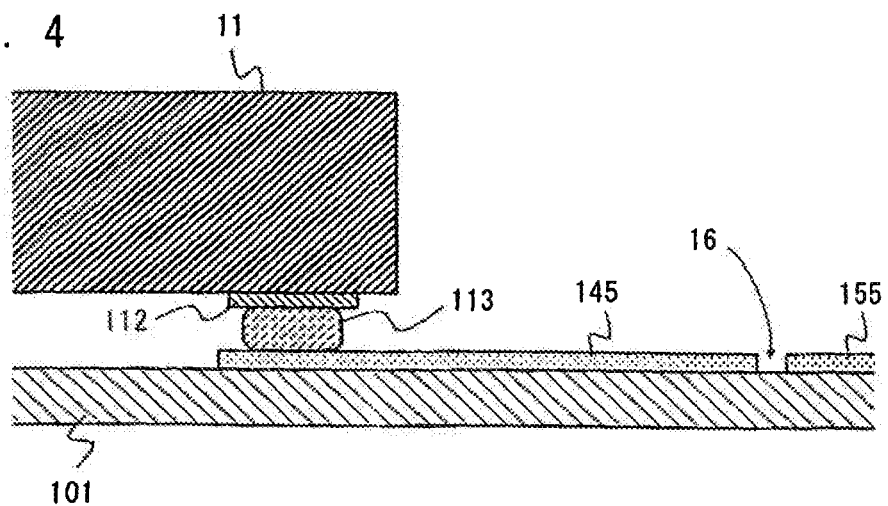
FIG. 4 is a schematic cross-sectional view along line A-A in FIG. 3.

FIG. 3 is an enlarged plan view showing the vicinity of the lead line pattern 14 and the heat dissipation pattern 15 located on the right side of the IC chip 11 shown in FIG. 1. In the example of FIG. 3, the lead line pattern 14 is made up of five lead lines 141 to 145 that are separated from one another. FIG. 4 is a schematic cross-sectional view along line A-A in FIG. 3. In FIG. 4, sealing resin is not shown. As shown in FIG. 4, the lead line 145 is formed on a flexible insulating film 101 and joined to the electrode 112 by a conductor bump 113. The other lead lines 141 to 144 are also joined to the IC chip 11 by the conductor bump 113 in the same manner as the lead line 145.

Further, as shown in FIG. 3, the lead lines 141 to 145 are arranged to radiate out from the short side of the IC chip 11. The radial end parts of the lead lines 141 to 145 correspond to projecting parts of the lead line pattern 14. Further, the heat dissipation pattern 15 is arranged to surround the end parts of the lead lines 141 to 145 with a gap 16 therebetween. In other words, the lead lines 141 to 145 are arranged to come inside the heat dissipation pattern 15. Specifically, projecting parts 151 to 156 of the heat dissipation pattern 15 extend between the respective lead lines 141 to 145, between the chip 11 and the line 141 and between the chip 11 and the line 145.

In this manner, the opposite parts of the lead line pattern 14 (the lead lines 141 to 145) and the heat dissipation pattern 15 are designed with an interdigitated structure and arranged to engage with each other with the gap 16 therebetween, thereby increasing the length of the opposite parts of the pattern 14 and the pattern 15 (i.e. the length of the boundary line or the length of the gap 16). Because the gap 16, which is the insulating film, has a lower heat conductivity than the patterns 14 and 15 made of a conductor such as copper or aluminum, it causes an increase in heat resistance at the boundary between the patterns 14 and 15. However, by making the total extension of the longitudinal length of the gap 16 long enough, it is possible to reduce the heat resistance between the lead line pattern 14 and the heat dissipation pattern 15. Note that it is easy to make the total extension of the longitudinal length of the gap 16 longer than the length of the short side of the IC chip 11. Thus, when conductor connection cannot be made between the IC chip 11 and the heat dissipation pattern 15, the higher heat dissipation effect can be expected in the heat dissipation structure according to the exemplary embodiment compared to the heat dissipation structure disclosed in JP 2004-111996 A (the structure in which the length of the interface between the IC chip and the heat dissipation conductive pattern is about the length of the short side of the IC chip).

Hereinafter, the heat dissipation effect that is obtained by the layout of the lead line pattern 14 and the heat dissipation pattern 15 described in the exemplary embodiment is described with reference to FIGS. 5A to 5D. FIG. 5A is a plan view where isothermal lines L1 to L8 are added to the layout of the patterns 14 and 15 shown in FIG. 3. FIG. 5B is a graph showing a temperature distribution along the X-axis of FIG. 5A. On the other hand, FIG. 5C is a plan view related to a comparative example in the case where the boundary line between the patterns 14 and 15 does not have an interdigitated shape. FIG. 5D is a graph showing a temperature distribution along the X-axis of FIG. 5C. It should be noted that the structure shown in FIG. 5C is designed by the inventor of the present invention for the purpose of comparison with the TCP 1 and it is thus not a publicly known structure.

As is obvious from comparison between FIGS. 5B and 5D, according to the exemplary embodiment, heat is efficiently released from the IC chip 11 to the heat dissipation pattern 15, so that the temperature of the IC chip 11 falls and the temperature of the heat dissipation pattern 15 rises. The temperature gradient along the boundary P1 of the IC chip 11 thereby becomes less steep as shown in FIG. 5B.

Because the temperature gradient near the IC chip 11, which is a heat source, is steep in FIGS. 5C and 5D, reducing the temperature gradient leads to efficient heat dissipation. By forming the lead line pattern 14 so as to radically spread out from the IC chip 11 as shown in FIGS. 1 and 3, it is possible to improve the heat dissipation effect. This is because the radial line layout is along the diffusion direction of heat current. By placing the radial lead line pattern 14 along the heat current diffusion direction in close proximity to the IC chip 11, the temperature gradient near the IC chip 11 becomes less steep as shown in FIGS. 5A and 5B, which allows efficient heat dissipation.

Further, with use of the radial lead line pattern 14, the total area of the lead line pattern 14 can be small. Therefore, the radial lead line pattern 14 is particularly effective when there is a concern about breakdown of the IC chip 11 due to ESD.

According to the exemplary embodiment, even when conductor connection of the heat dissipation pattern 15 to the IC chip 11 is unavailable for the countermeasure to ESD, the constraints on the electrode layout of the IC chip 11 or the like, it is possible to reduce the heat resistance between the IC chip 11 and the heat dissipation pattern 15 and increase the heat dissipation effect. Further, by making the total extension of the gap 16 long enough, it is possible to obtain the heat dissipation effect which is equal to when making conductor connection between the IC chip 11 and the heat dissipation pattern 15.

Figure 6:
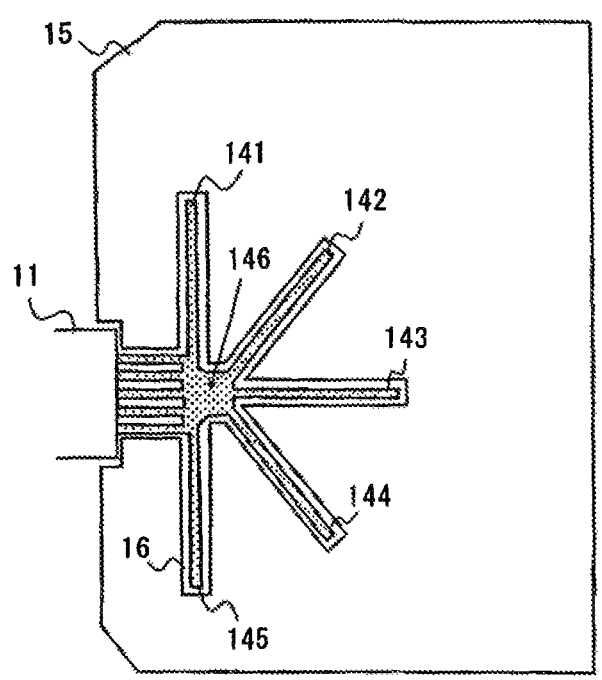
FIG. 6 is a view showing an alternative example of a lead line pattern and a heat dissipation pattern.

Noted that the shape of the lead line pattern 14 shown in FIGS. 1, 3 and 5 is just an example. For example, when an electrical connection can be made, the lead line pattern 14 may have an integral conductive pattern in which the lead lines 141 to 145 are connected at a center part 146 as shown in FIG. 6.

Figure 7A:
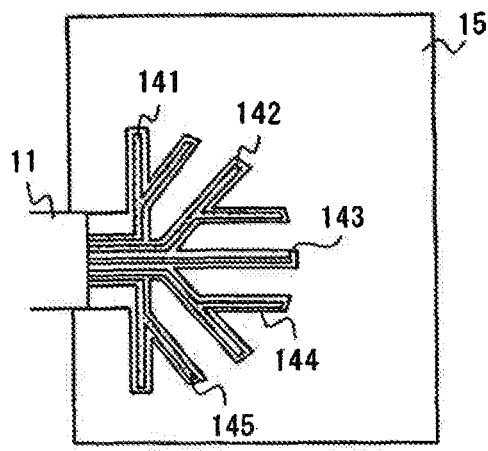
FIGS. 7A to 7D are views showing alternative examples of a lead line pattern and a heat dissipation pattern.
Figure 7B:
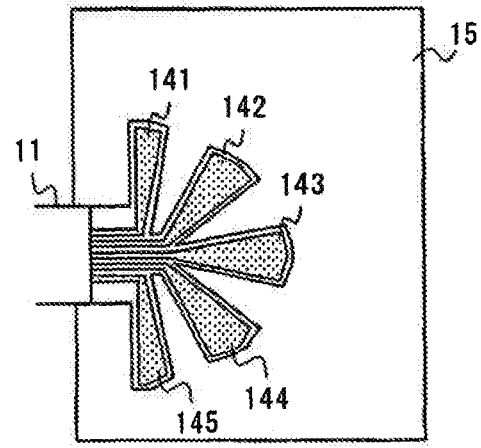
Figure 7C:
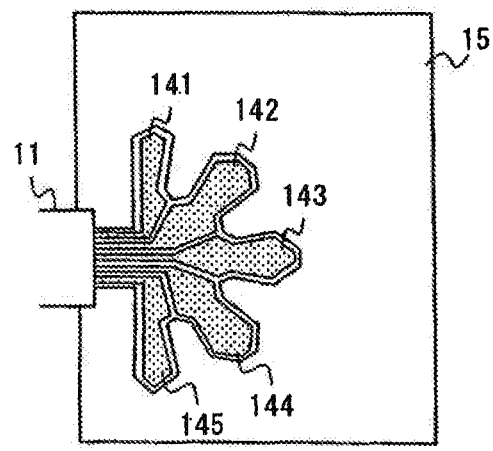
Figure 7D:
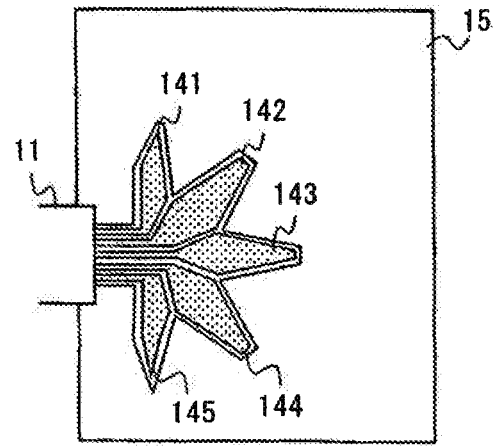
Figure 8A:
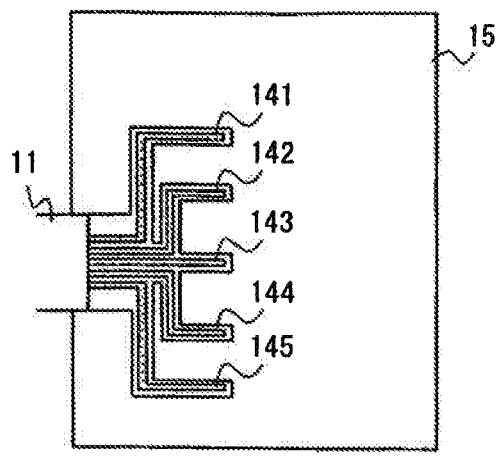
FIGS. 8A to 8E are views showing alternative examples of a lead line pattern and a heat dissipation pattern.
Figure 8D:
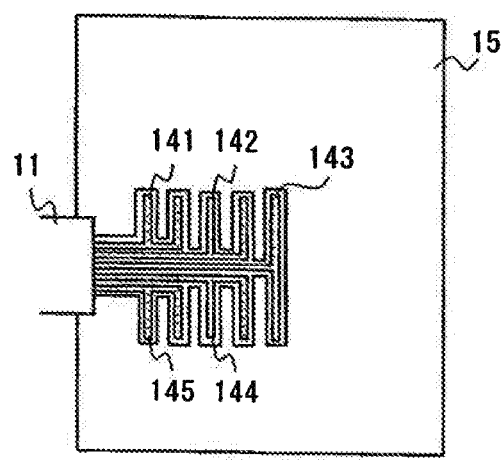
Figure 8B:
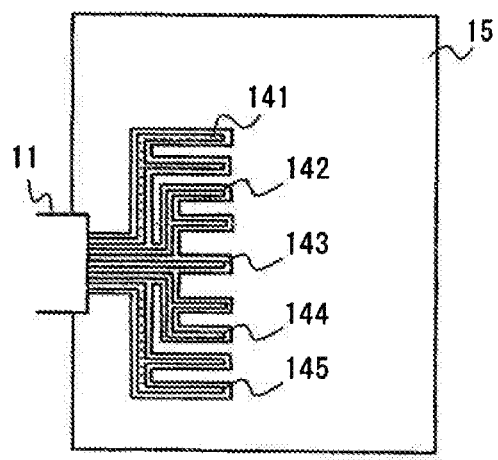
Figure 8E:
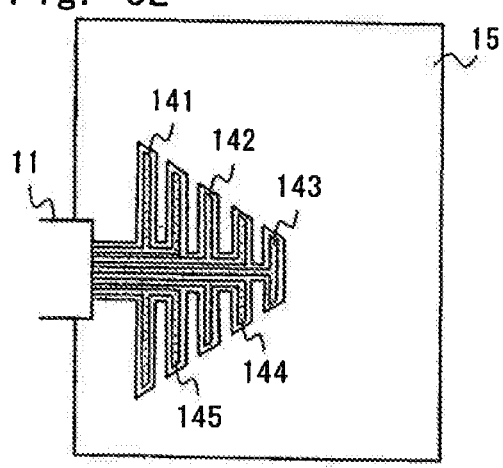
Figure 8C:
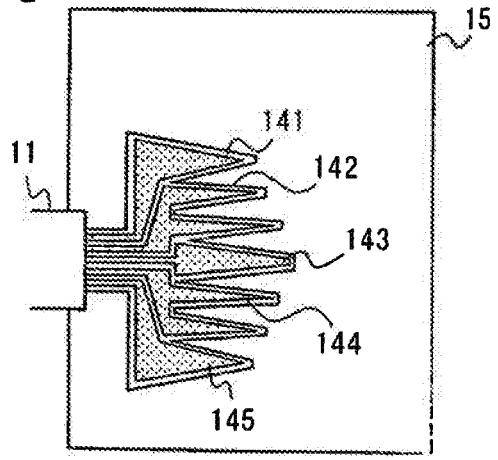

Alternative examples of the lead line pattern 14 are shown in FIGS. 7A to 7D and FIGS. 8A to 8E. FIGS. 7A to 7D show alternative examples of the lead line pattern 14 having the radial lead lines 141 to 145. FIG. 7A is an example in which each of the lead lines 141 to 145 shown in FIG. 3 branches off to thereby further increase the boundary length. FIG. 7B is an example in which each of the lead lines 141 to 145 becomes wider toward their ends. FIGS. 7C and 7D are examples in which the end of each of the lead lines 141 to 145 is wider than the root and each has a corrugated rim to thereby further increase the boundary length.

FIGS. 8A to 8E show alternative examples of the lead line pattern 14 having the non-radial lead lines 141 to 145. Although the non-radial lead line pattern 14 is likely to be less advantageous than the radial pattern in terms of heat current diffusion characteristics, it is effective when it is difficult to adopt the radial lead line pattern 14 due to layout constraints.

Further, the heat dissipation pattern 15 may be electrically floating or provided with a certain potential. For example, the heat dissipation pattern 15 may be grounded. In the heat dissipation structure according to the exemplary embodiment, the lead line pattern 14 and the heat dissipation pattern 15 are physically spaced from each other. Therefore, the heat dissipation structure is applicable also when a given potential is provided to the heat dissipation pattern 15.

Furthermore, the electrodes 112 for heat dissipation may be connected to a power supply potential, a ground potential or the like inside the IC chip 11. Stated differently, the lead line pattern 14 (the lead lines 141 to 145) may be electrically connected to an external device through an internal line of the IC chip 11. In the heat dissipation structure according to the exemplary embodiment, the respective lead lines 141 to 145 of the lead line pattern 14, and the lead line pattern 14 and the heat dissipation pattern 15 are respectively physically spaced from each other. Therefore, the heat dissipation structure is applicable also when a given potential is supplied to the respective lead lines 141 to 145 of the lead line pattern 14.

Although the case where the heat dissipation pattern 15 is one island pattern is described above, the heat dissipation pattern 15 may be divided into a plurality of island patterns.

One feature of the heat dissipation structure according to the exemplary embodiment is that the boundary line between the lead line pattern 14 and the heat dissipation pattern 15 has an interdigitated shape (including a corrugated, zigzag, meandering or star-like shape). The layout is generally applicable to the part where the lead line pattern 14 and the heat dissipation pattern 15 are arranged in close proximity to each other.

Figure 9A:
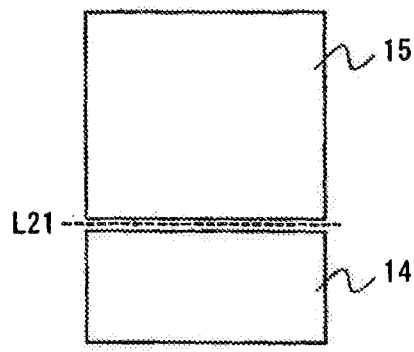
FIGS. 9A and 9B are views showing alternative examples of a lead line pattern and a heat dissipation pattern.
Figure 9B:
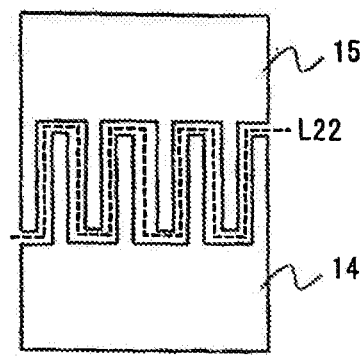
Figure 10A:
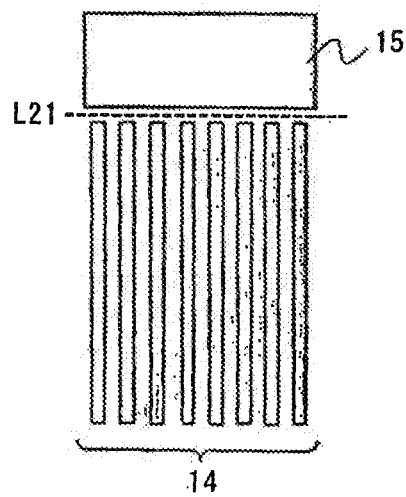
FIGS. 10A and 10B are views showing alternative examples of a lead line pattern and a heat dissipation pattern.
Figure 10B:
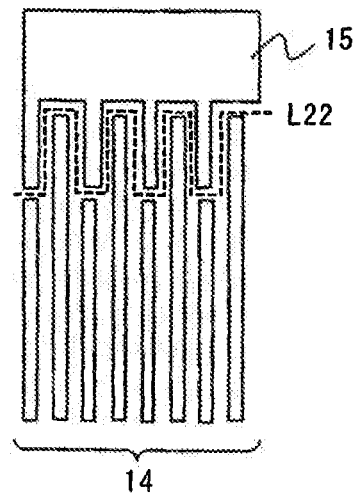

Specifically, it is more preferable that the boundary line (L22) between the lead line pattern 14 and the heat dissipation pattern 15 opposite to each other with a gap therebetween has an interdigitated shape as shown in FIG. 9B, compared to that the boundary line (L21) between the patterns 14 and 15 is a straight line as shown in FIG. 9A. Further, when the lead line pattern 14 includes a plurality of fine lines (FIG. 10A), it is preferred to vary the lengths of the respective fine lines and make a comb shape, so that the boundary line (L22) between the patterns 14 and 15 has an interdigitated shape (FIG. 10B). Furthermore, when the lead line pattern 14 and the heat dissipation pattern 15 both include a plurality of fine lines, it is preferred to make the respective patterns have a comb shape and engage with each other with a gap therebetween, so that the boundary line (L22) between the patterns 14 and 15 has an interdigitated shape (FIG. 11B).

Second Exemplary Embodiment

Figure 11A:
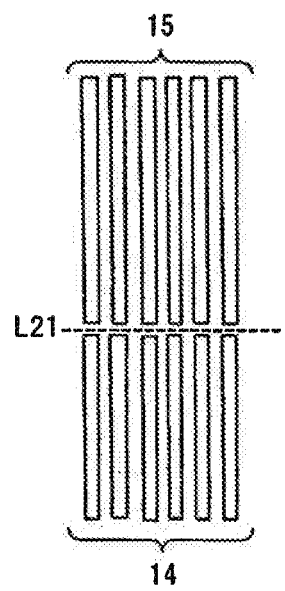
FIGS. 11A and 11B are views showing alternative examples of a lead line pattern and a heat dissipation pattern.
Figure 11B:
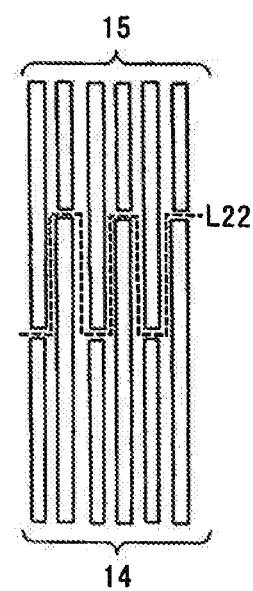
Figure 12:
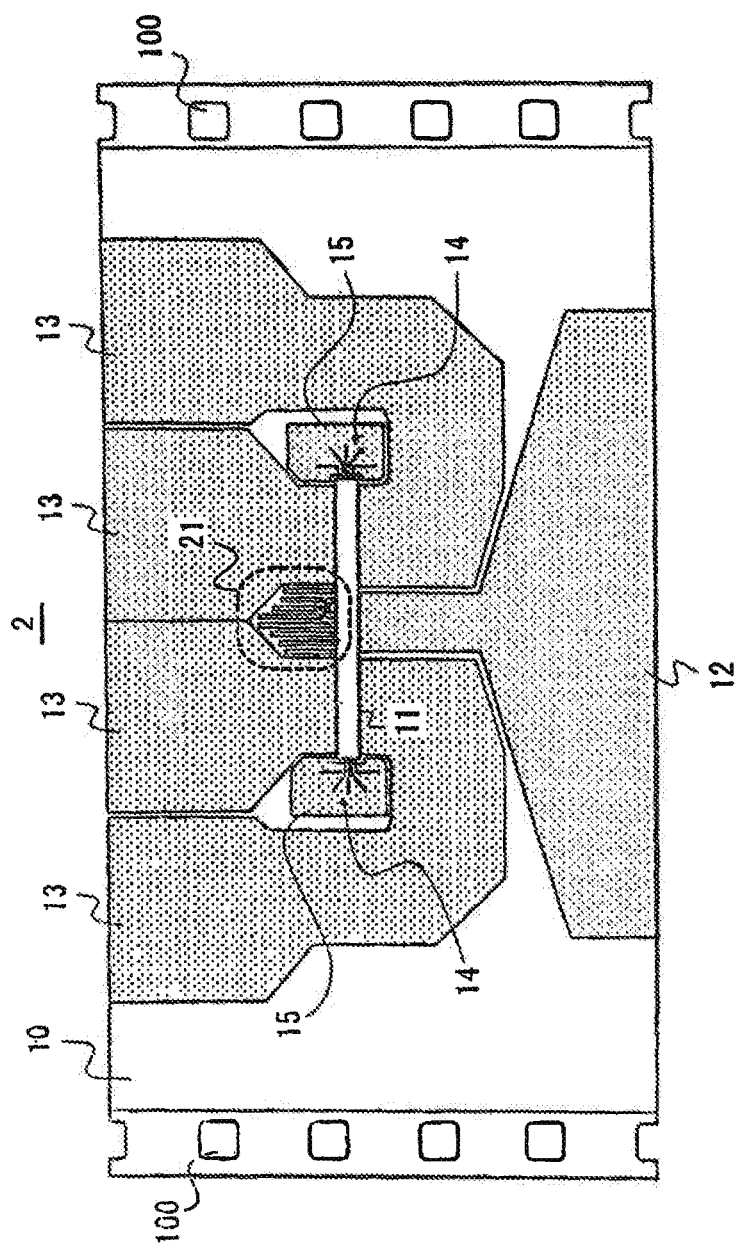
FIG. 12 is a plan view schematically showing the structure of a semiconductor device according to a second exemplary embodiment of the invention.

In this exemplary embodiment, applications of the conductive pattern layout shown in FIGS. 9B, 10B and 11B are described. FIG. 12 is a schematic plan view of a TCP 2 according to the exemplary embodiment. In the example of FIG. 12, dummy lines (dummy leads) are formed in an area 21 where the signal input/output patterns 13 and 14 are not formed. It is generally practiced in a semiconductor device such as a TCP using a flexible wiring board to form dummy lines in an open part. The dummy lines contribute also to the heat dissipation of the IC chip 11.

Further, in the example of FIG. 12, a folded line 24 is formed in the area 21. The folded line 24 connects between the two electrodes 112 which are not connected to an external device among the electrodes of the IC chip 11 in a folded fashion. The folded line 24 is placed for power supply, for example. When the folded line 24 exists, the dummy lines are divided by the folded line 24. In this exemplary embodiment, the layout of the conductive pattern shown in FIGS. 9 to 11 is used for improving the heat conductivity between the divided dummy lines and the folded line 24.

Figure 13:
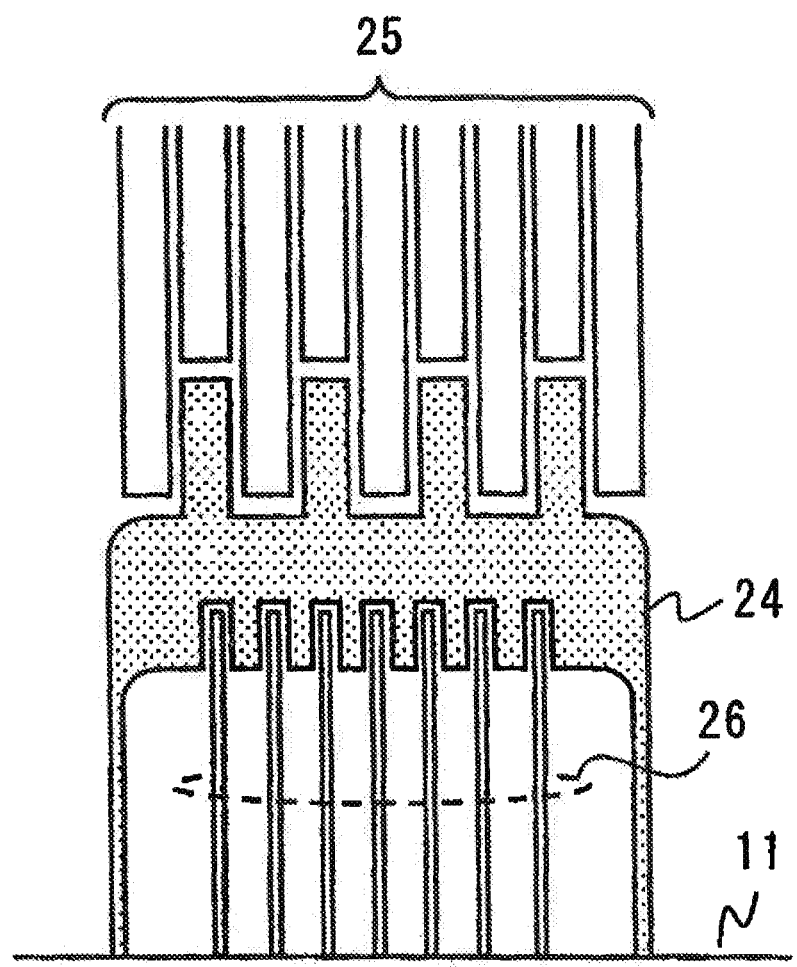
FIG. 13 is an enlarged plan view showing the vicinity of a lead line pattern and a heat dissipation pattern included in the semiconductor device shown in FIG. 12.

FIG. 13 is an enlarged plan view showing the vicinity of the folded line 24 placed in the area 21. The folded line 24 is not connected to an external device and in conductor connection to the electrode 112 of the IC chip 11. Thus, the folded line 24 corresponds to the lead line pattern 14. Further, dummy lines 25 are physically spaced from each of the IC chip 11, the signal line patterns 12 and 13 and the folded line 24 (which corresponds to the lead line pattern 14), and it has a larger surface area than the folded line 24. Thus, the dummy lines 25 correspond to the heat dissipation pattern 15. Dummy lines 26 are connected to a dummy electrode of the IC chip 11 through a conductor bump to ensure stable connection with the flexible wiring board 10. Note that the dummy lines 26 are not necessarily in conductor connection to the electrode of the IC chip 11.

As shown in FIG. 13, the opposite parts of the folded line 24 (which corresponds to the lead line pattern 14) and the dummy lines 25 (which correspond to the heat dissipation pattern 15) have an interdigitated shape and engage with each other with a gap therebetween, thereby reducing heat resistance. Likewise, it is preferred that the boundary line between the dummy lines 26 and the folded line 24 on the IC chip 11 side also has an interdigitated shape. It is thereby possible to reduce the heat resistance from the IC chip 11 to the dummy lines 25.

In the first and second exemplary embodiments of the present invention, the structure in which the lead line pattern is in conductor connection with the electrodes 112 which are placed separately from the electrodes 111 being connected to an external device and principally used for the purpose of ensuring stable connection and dissipating heat without being connected to an external device is described. However, at least one of the input signal line pattern 12 and the output signal line pattern 13 which are connected to the electrodes 111 being connected to an external device may be placed opposite to the heat dissipation pattern 15 with a gap therebetween. In other words, at least one of the input signal line pattern 12 and the output signal line pattern 13 may serve also as the lead line pattern.

As described above, in the TCP 1 and the TCP 2, the lead line pattern 14 and the heat dissipation pattern 15 are arranged to engage with each other with a gap therebetween, and it is thus possible to reduce heat resistance without making electrical connection between the lead line pattern 14 and the heat dissipation pattern 15. Thus, the input signal line pattern 12 and the output signal line pattern 13 which should avoid electrical connection with the heat dissipation pattern 15 may be used as the lead line pattern 14. In this manner, because the signal line patterns 12 and 13 or the like that are connected to an external device can be used as the lead line pattern 14, the heat dissipation structure with the lead line pattern 14 and the heat dissipation pattern 15 has an advantage of less constraints on layout.

Further, the heat dissipation structure of the semiconductor device described in the above first and second exemplary embodiments of the present invention is especially effective in a semiconductor device using a flexible wiring board, particularly in a TCP having a structure in which a conductive layer formed on an insulating film is a single layer and an IC chip is flip-chip mounted on the same principal surface as the conductive layer. This packaging is called chip on film (COF). In the COF, there is no need to make a hole in a part of the insulating film opposite to the IC chip and there is no need to use a flying lead. The COF in which the conductive layer is formed only on the principal surface of the film and the IC chip is mounted on the principal surface is a generally used package type for its compatibility with a fine pitch structure and its ability to reduce the manufacturing cost of the TCP and ensure the flexibility. On the other hand, in the TCP having such a structure, severe layout constraints are imposed on the conductive pattern, and the IC chip temperature is likely to rise. However, by using the heat dissipation structure described in the first and second exemplary embodiments, it is possible to enhance the heat dissipation effect when conductor connection cannot be made between the IC chip 11 and the heat dissipation pattern 15.

However, the heat dissipation structure of the semiconductor device described in the first and second exemplary embodiments is also applicable to a semiconductor device that uses a flexible wiring board different from a TCP. Further, a wiring layer (conductive layer) of a flexible wiring board may have a multi-layer structure. Furthermore, a conductive layer may be formed on both principal surfaces of a flexible wiring board. In addition, mounting of the IC chip 11 into the flexible wiring board 10 is not limited to the flip-chip mounting described above. For example, it is applicable to tape automated bonding (TAB) mounting. Further, the heat dissipation structure is also applicable to a semiconductor device that uses a rigid wiring board, not limited to a flexible wiring board.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:
1. A semiconductor device comprising:
  a wiring substrate including:
    a first surface including:
    a first long side;
    a second long side opposite the first long side;
    a first short side; and
    a second short side opposite the first short side;
    a second surface opposite the first surface;
    a first heat dissipation conductive pattern formed on the first surface;
    a second heat dissipation conductive pattern formed on the first surface;
    a first wiring formed on the first surface; and
    a second wiring formed on the first surface, and
      a semiconductor chip disposed on the wiring substrate and including:
    a third surface including:
    a third long side;
    a fourth long side opposite the third long side;
    a third short side; and
    a fourth short side opposite the third short side; and
    a fourth surface opposite the third surface,
  wherein, in plan view, the semiconductor chip is disposed on the wiring substrate:
    such that the third long side of the semiconductor chip extends along with the first long side of the wiring substrate;
    such that the fourth long side of the semiconductor chip extends along with the second long side of the wiring substrate;
    such that the third short side of the semiconductor chip extends along with the first short side of the wiring substrate; and
    such that the fourth short side of the semiconductor chip extends along with the second short side of the wiring substrate,
  wherein one end portion of the first heat dissipation conductive pattern overlaps with the semiconductor chip,
  wherein another end portion of the first heat dissipation conductive pattern is terminated on the wiring substrate without being connected to any other wirings and any other conductive patterns,
  wherein, in plan view, the second heat dissipation conductive pattern is adjacent to the first heat dissipation conductive pattern without overlapping with the semiconductor chip, wherein the second heat dissipation conductive pattern is spaced apart from any of the first heat dissipation conductive pattern and the first and second wirings without electrically connecting with the semiconductor chip, the first heat dissipation conductive pattern, the first wiring and the second wiring, wherein the second heat dissipation conductive pattern has a larger surface area than the first heat dissipation conductive pattern, wherein, in plan view, the first wiring extends toward the first long side of the wiring substrate from the third long side of the semiconductor chip, wherein a first end portion of the first wiring overlaps with the semiconductor chip, wherein, in plan view, the first wiring is adjacent to the second heat dissipation conductive pattern without intervening any other wirings and any other conductive patterns between the first wiring and the second heat dissipation conductive pattern, wherein, in plan view, the second wiring extends toward the first long side of the wiring substrate, wherein a second end portion of the second wiring overlaps with the semiconductor chip, and wherein, in plan view, the second wiring is adjacent to the second heat dissipation conductive pattern without intervening any other wirings and any other conductive patterns between the second wiring and the second heat dissipation conductive pattern.

2. The semiconductor device according to the claim 1, wherein the portion of the first heat dissipation conductive pattern, the first end portion of the first wiring, and the second end portion of the second wiring overlap with the third long side of the semiconductor chip in plan view, and wherein the second wiring extends toward the first long side of the wiring substrate from the third long side of the semiconductor chip.

3. The semiconductor device according to the claim 2, wherein a length of the second wiring is greater than a length of the first wiring.

4. The semiconductor device according to the claim 2, wherein a length of the second wiring is substantially same with a length of the first wiring.

5. The semiconductor device according to the claim 1, wherein the portion of the first heat dissipation conductive pattern overlaps with the third short side of the semiconductor chip in plan view, wherein the first end portion of the first wiring overlaps with the third long side of the semiconductor chip in plan view, wherein the second end portion of the second wiring overlaps with the fourth long side of the semiconductor chip in plan view, and wherein the second wiring extends toward the first long side of the wiring substrate from the fourth long side of the semiconductor chip.

6. The semiconductor device according to the claim 5, wherein a length of the second wiring is greater than a length of the first wiring.

7. The semiconductor device according to the claim 5, wherein the another end portion of the first heat dissipation conductive pattern is wider than the one end portion of the first heat dissipation conductive pattern.

8. The semiconductor device according to the claim 7, wherein the another end portion of the first heat dissipation conductive pattern is adjacent to the second wiring.

9. The semiconductor device according to the claim 2, wherein the second heat dissipation conductive pattern includes a protruding portion pattern extending toward the first long side of the wiring substrate.

10. The semiconductor device according to the claim 3, wherein the second heat dissipation conductive pattern includes a protruding portion pattern extending toward the first long side of the wiring substrate.

11. The semiconductor device according to the claim 5, wherein the second heat dissipation conductive pattern includes a protruding portion pattern extending toward the first long side of the wiring substrate.

12. The semiconductor device according to the claim 6, wherein the second heat dissipation conductive pattern includes a protruding portion pattern extending toward the first long side of the wiring substrate.

13. The semiconductor device according to the claim 7, wherein the second heat dissipation conductive pattern includes a protruding portion pattern extending toward the first long side of the wiring substrate.

14. The semiconductor device according to the claim 8, wherein the second heat dissipation conductive pattern includes a protruding portion pattern extending toward the first long side of the wiring substrate.

15. The semiconductor device according to the claim 2, wherein the semiconductor chip is disposed closer to the first long side of the wiring substrate than the second long side of the wiring substrate.

16. The semiconductor device according to the claim 5, wherein the semiconductor chip is disposed closer to the first long side of the wiring substrate than the second long side of the wiring substrate.

17. The semiconductor device according to the claim 1, wherein the semiconductor chip is disposed on the first surface of the wiring substrate.

18. The semiconductor device according to the claim 2, wherein the semiconductor chip is disposed on the first surface of the wiring substrate.

19. The semiconductor device according to the claim 5, wherein the semiconductor chip is disposed on the first surface of the wiring substrate.

* * * * *